US006815646B2

(12) United States Patent
Ito et al.

(10) Patent No.: US 6,815,646 B2
(45) Date of Patent: Nov. 9, 2004

(54) CERAMIC SUBSTRATE FOR SEMICONDUCTOR MANUFACTURE/INSPECTION APPARATUS, CERAMIC HEATER, ELECTROSTATIC CLAMPLESS HOLDER, AND SUBSTRATE FOR WAFER PROBER

(75) Inventors: Yasutaka Ito, Ibi-gun (JP); Yasuji Hiramatsu, Ibi-gun (JP)

(73) Assignee: Ibiden Co., Ltd., Ogaki (JP)

( * ) Notice: Subject to any disclaimer, the term of this patent is extended or adjusted under 35 U.S.C. 154(b) by 0 days.

(21) Appl. No.: 10/088,098

(22) PCT Filed: Jul. 25, 2001

(86) PCT No.: PCT/JP01/06395

§ 371 (c)(1),
(2), (4) Date: May 30, 2002

(87) PCT Pub. No.: WO02/09171

PCT Pub. Date: Jan. 31, 2002

(65) Prior Publication Data

US 2003/0015515 A1 Jan. 23, 2003

(30) Foreign Application Priority Data

Jul. 25, 2000 (JP) ........................................ 2000-223767

(51) Int. Cl.$^7$ ................................................. H05B 3/68
(52) U.S. Cl. ............................. 219/444.1; 219/465.1; 219/467.1; 219/543; 219/468.1; 219/546
(58) Field of Search ......................... 219/444.1, 460.1, 219/465.1, 466.1, 467.1, 468.1, 543, 544, 546–548

(56) References Cited

U.S. PATENT DOCUMENTS

| 4,621,064 | A | 11/1986 | Matsuura et al. |
| 6,465,763 | B1 | 10/2002 | Ito et al. |
| 6,475,606 | B2 | 11/2002 | Niwa |
| 6,507,006 | B1 | 1/2003 | Hiramatsu et al. |
| 6,677,557 | B2 | 1/2004 | Ito et al. |
| 6,710,307 | B2 | 3/2004 | Ito et al. |
| 2002/0043527 | A1 | 4/2002 | Ito |
| 2003/0015521 | A1 | 1/2003 | Ito |

FOREIGN PATENT DOCUMENTS

| EP | 0 743 290 A1 | 11/1996 |
| EP | 0 771 772 A2 | 5/1997 |
| EP | 0798278 | 10/1997 |
| JP | 58-218143 | * 12/1983 |
| JP | 61-14166 | 1/1986 |
| JP | 5-330924 | 12/1993 |
| JP | 6-80473 | 3/1994 |
| JP | 6 151332 | 5/1994 |
| JP | 6-157132 | 6/1994 |
| JP | 6-219844 | 8/1994 |
| JP | 6-219848 | 8/1994 |
| JP | 7-187620 | 7/1995 |
| JP | 8-130237 | 5/1996 |
| JP | 08-130237 | * 5/1996 |

OTHER PUBLICATIONS

T. Fawcett, The American Ceramic Society Bulletin, vol. 75, No. 10, pp. 76–80, "Raw Materials Influence the Alpha–Particle Emission Rate of AlN", October 1996.
Japanese w/ English translation of Experimental report (exhibit 4).

(List continued on next page.)

*Primary Examiner*—Shawntina T. Fuqua
(74) *Attorney, Agent, or Firm*—Oblon, Spivak, McClelland, Maier & Neustadt, P.C.

(57) ABSTRACT

The present invention discloses a ceramic substrate for semiconductor manufacture and/or inspection conducive to decrease radiated α-rays and to minimize changes in thermal conductivity as a function of time, thereby yielding a superior temperature controllability. This invention is related to a ceramic substrate for apparatuses for use in semiconductor manufacture and/or inspection, wherein the level of α-rays radiated from said ceramic substrate exceeds 0.25 c/cm$^2$·hr and is not higher than 50 c/cm$^2$·hr.

10 Claims, 6 Drawing Sheets

OTHER PUBLICATIONS

Japanese w/ English translation of Experimental report (exhibit 5).

Japanese w/ English translation of Analysis and experimental report (exhibit 6).

Japanese w/ English translation of Analysis and experimental report (exhibit 7).

Japanese w/ English translation of Ceramic Data Book (portion) p. 68, 1993 (cited as exhibit 8).

Japanese w/ English translation of New Ceramics & Electronic Ceramics, vol. 11, No. 9, pp. 13–18, "New Ceramics" 1998.

Japanese w/ English translation of Electric Materials, pp. 51–57, "Electrostatic chuck and its application", Jul. 1996.

Japanese w/ English translation of New Materials–Technology & Applications, vol. 3, No. 4, pp. 51–53, Apr., 1992.

Japanese w/ English translation of Electronic Ceramics, vol. 22, No. 104, pp. 51–54, 1991.

Japanese w/ English translation of Bulletin of the Ceramic Society of Japan, vol. 26, No. 8, pp. 733–737, "Ceramics", 1991.

Japanese w/ English translation of Bulletin of the Ceramic Society of Japan, vol. 29, No. 8, pp. 679–681, "Ceramics", 1994.

Japanese w/ English translation of JFCA Fine Ceramics Catalogues, p. 48, (Raw material, Secondary material, Material, Parts, Manufacturing/Processing device, Measurement/Evaluation device, Service), 1996.

Japanese w/ English translation of Journal of the Society of Powder Technology, Japan, vol. 34, No. 8, pp. 610–616, "Thus a powder is produced", 1997.

Japanese w/ English translation of Fine Ceramics Report, vol. 15, No. 10, pp. 226–230, 1997.

U.S. patent application Ser. No. 10/088,098, Ito et al., filed May 30, 2002.

U.S. patent application Ser. No. 10/732,296, Ito et al., filed Dec. 11, 2003.

U.S. patent application Ser. No. 10/746,081, Hiramatsu et al., filed Dec. 29, 2003.

U.S. patent application Ser. No. 10/755,308, Hiramatsu et al., filed Jan. 13, 2004.

U.S. patent application Ser. No. 10/766,027, Ito et al., filed Jan. 29, 2004.

* cited by examiner (a)

(b)

(e)

(f)

(g)

(a)

(b)

CERAMIC SUBSTRATE FOR SEMICONDUCTOR MANUFACTURE/INSPECTION APPARATUS, CERAMIC HEATER, ELECTROSTATIC CLAMPLESS HOLDER, AND SUBSTRATE FOR WAFER PROBER

TECHNICAL FIELD

The present invention relates essentially to the ceramic substrate, ceramic heater, electrostatic chuck and substrate for the wafer prober for semiconductor manufacture and/or inspection and more particularly to a ceramic substrate for semiconductor manufacture and/or inspection which is conducive to the prevention of electrical errors, decrease in electrostatic chucking power, and the suppression of generation of lattice defects of the silicon wafer.

BACKGROUND ART

Semiconductor devices are manufactured through a process which comprises coating a photosensitive resin as an etching resist on a semiconductor wafer and etching the uncoated area.

While the photosensitive resin is applied in the form of a liquid to the surface of a semiconductor wafer by means of a spin coater or the like, it must be dried after coating to dissipate the solvent etc. and the thus-coated semiconductor wafer is set on a heater and heated.

The conventional metallic heater heretofore used for this purpose comprises a resistance heating element disposed on the reverse side of an aluminum plate.

However, such a metallic heater has the following disadvantages.

First, because it comprises a metallic material, the heater plate must be as thick as about 15 mm. This is because a thin metal plate undergoes thermal expansion on the heating mode to develop a curl and strains to damage or tip the semiconductor wafer placed on the metal plate. However, increasing the thickness of the heater plate leads to increases in heater weight and bulk.

Moreover, while the heater temperature is controlled by varying the voltage and current applied to the resistance heating element, the great thickness of the metal plate causes the problem that the temperature of the heater plate cannot timely follow changes in voltage and current values, thus making temperature control difficult.

Therefore, Japanese Kokai Publication Hei-9-306642 and Japanese Kokai Publication Hei-4-324276, for instance, proposed ceramic heaters each comprising a substrate board comprising AlN, which is a non-oxide ceramic material of high thermal conductivity and high strength, and a resistance heating element formed internally of said substrate board.

Furthermore, JP 2798570 discloses an electrostatic chuck comprising an AlN substrate, a resistance heating element formed therein, and, for the purpose of attracting and setting in position a semiconductor wafer on a heater, static electrodes as embedded in said AlN substrate.

SUMMARY OF THE INVENTION

However, when such a heater or an electrostatic chuck having a resistance heating element formed in an AlN substrate is employed, as compared with a heater based on an aluminum plate, there is encountered incomprehensible phenomenon that an accurate temperature control becomes difficult with passage of the time.

Initially, malfunction of the apparatus itself was supposed for the reason of the phenomenon, however, it has proved that the accurate temperature control cannot be conducted even though the heater and the like are brought into the direct contact with the ceramic.

The inventors scrutinized such a problem inherent in the prior art and found surprisingly that the cause of the trouble lies in the α-rays radiated from the ceramic substrate and that by controlling the level of those α-rays below a given value, the accurate temperature control can be possible even after passage of the time. Based on these findings, inventors have completed the present invention.

That is, the present invention is a ceramic substrate for apparatus for use in semiconductor manufacture and/or inspection, which is used under the temperature adjustment condition such as heating or cooling, wherein the level of α-rays radiated from the ceramic substrate exceeds 0.25 c/cm$^2$·hr and is not higher than 50 c/cm$^2$·hr.

Also, the ceramic heater using the ceramic substrate of the present invention is a ceramic heater, for heating a semiconductor, comprising a ceramic substrate and a heating element disposed on the surface or internally thereof, wherein the level of α-rays radiated from the ceramic substrate exceeds 0.25 c/cm$^2$·hr and is not higher than 50 c/cm$^2$·hr.

In addition, the electrostatic chuck of the present invention is an electrostatic chuck comprising a ceramic substrate and electrodes (electrostatic electrodes) embedded therein, wherein the level of α-rays radiated from the ceramic substrate exceeds 0.25 c/cm$^2$·hr and is not higher than 50 c/cm$^2$·hr.

Further, the substrate for the wafer prober of the present invention is a substrate for a wafer prober comprising a ceramic substrate and a conductor layer formed on the surface thereof, wherein the level of α-rays radiated from the surface (conductive layer formed surface) of the ceramic substrate exceeds 0.25 c/cm$^2$·hr and is not higher than 50 c/cm$^2$·hr.

Figure 1:
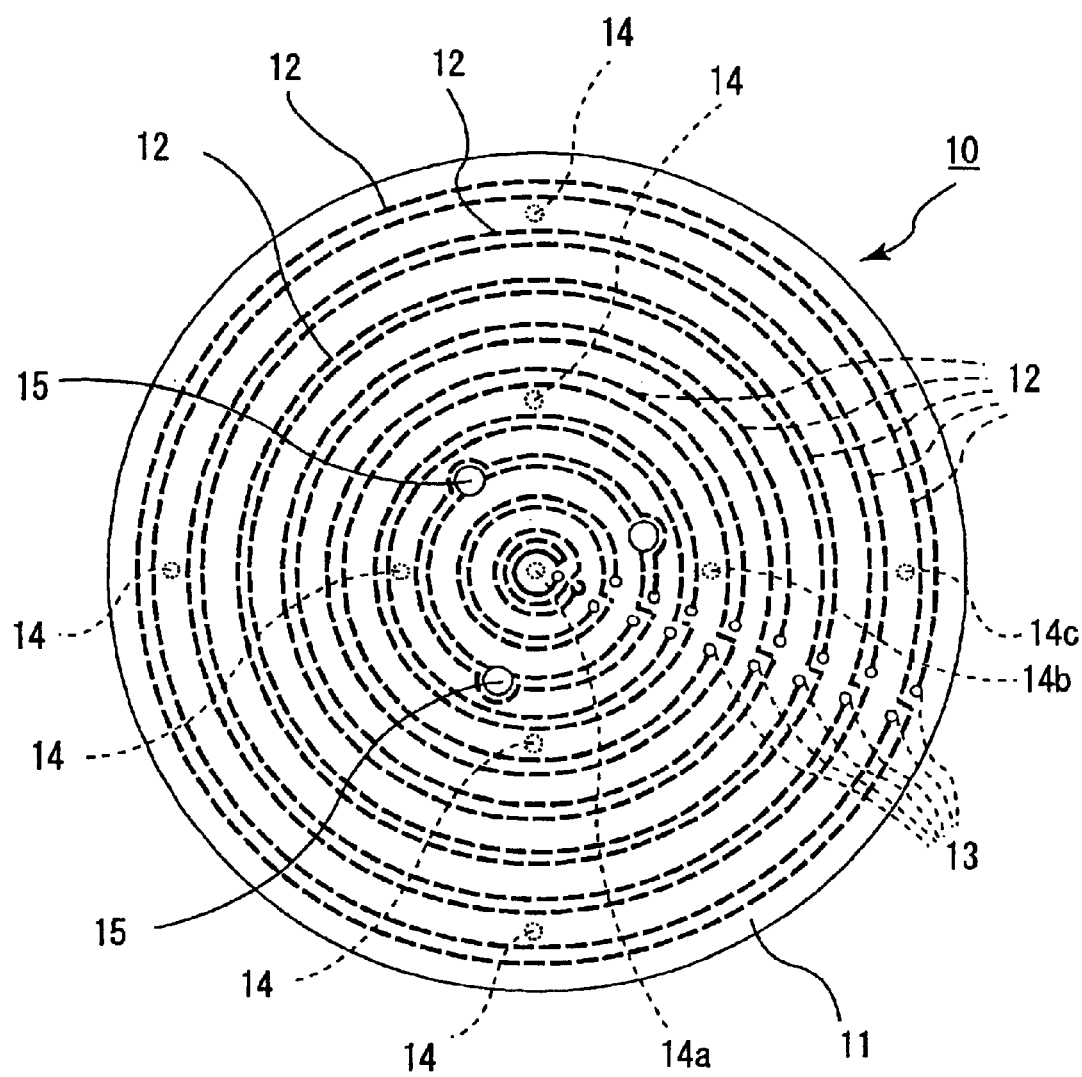
FIG. 1 is a schematic plain view of a ceramic heater as an embodiment of the invention.

EXPLANATION OF NUMERIC SYMBOLS 2. chuck top conductor layer
3. ceramic substrate 5. guard electrode
6. ground electrode
7. grooves
8. air suction holes
10. ceramic heater
11. heater board
12, 24, 41. resistance heating element
13. external terminals
14. bottomed holes
15. through holes
16. lifter pins
17. blind holes
18. conductor-filled through holes
19. semiconductor wafer
20. electrostatic chuck
22. chuck positive electrode static layer
23. chuck negative electrode static layer
25. ceramic dielectric film
36, 37. conductor-filled through holes
38. blind holes
39, 390, 391. External terminal
101. substrate for wafer prober
410. metal covering layer

DISCLOSURE OF INVENTION

As mentioned above, the inventors scrutinized such a problem inherent in the prior art and found surprisingly that the cause of the trouble lies in the α-rays radiated from the ceramic substrate. That is, radioactive elements such as uranium and thorium are present in the order of ppb, as impurities, inside the ceramic substrate.

Therefore, it is considered that when: α-rays are generated from such uranium or thorium; and the α-rays transmit through the inside of the ceramic, covalent bonds of AlN, SiC and the like are cut off so that the thermal conductivity thereof decreases with passage of time.

In other words, it is presumed that since the thermal conductivity of the ceramic substrate changes with passage of time, appropriate adjustment based on initial temperature control data becomes impossible so that accurate temperature control becomes impossible.

In the case that the ceramic substrate of the present invention is used as a ceramic heater, if the level of α-rays exceeds 50 c/cm$^2$·hr, the generated α-rays cause the covalent bonds of SiC or AlN to be cut off. It is, therefore, considered that, with passage of time, the thermal conductivity drops. If the thermal conductivity drops, response to temperature-rising or temperature-dropping deteriorates so that accurate temperature control cannot be attained.

The same effect is found in the case of an electrostatic chuck or in the case of a substrate for a wafer prober. In any case accompanied with heating or cooling, the thermal conductivity changes so that accurate temperature control cannot be attained.

In the ceramic substrate of the present invention, which is used under a temperature adjustment condition such as heating or cooling and is used in a semiconductor wafer producing/examining device, the level of α-rays emitted from a surface of the semiconductor wafer (a semiconductor wafer placing face, a heating face, a conductor layer formed face) exceeds 0.25 c/cm$^2$·hr and is not higher than 50 c/cm$^2$·hr, desirably exceeds 0.25 c/cm$^2$·hr and is not higher than 5 c/cm$^2$·hr.

By setting the level of α-rays within such a range, a change in the thermal conductivity over time can be suppressed. In the case of the ceramic substrate (in a disc form) having a diameter not less than 200 mm, the probability that α-rays transmitted through the substrate becomes high. Thus, the level of α-rays is most desirably not higher than 5 c/cm$^2$·hr. If the level of α-rays is not higher than 5 c/cm$^2$·hr, a change in the thermal conductivity can be set to about zero within the range of temperatures of 100° C. or more.

Furthermore, if the level of α-rays is not higher than 1 c/cm$^2$·hr, the ratio of the change becomes 1% or less in about 10 years even at ambient temperature. Thus, there is not any problems for practical use.

The level of α-rays is preferably 0.25 c/cm$^2$·hr or more. This is because the ceramic substrate must be made very pure and costs are required more than needed in order to adjust the level of α-rays to not higher than 0.25 c/cm$^2$·hr. Accordingly, if the level of α-rays is not higher than 50 c/cm$^2$·hr, the level of α-rays may exceed 0.25 c/cm$^2$·hr.

While, in the present invention, the change in the heat conductivity is successfully inhibited by reducing the emission level of α-rays, this causal relationship of the level of α-rays to the change of thermal conductivity was discovered for the first time by the inventors of the present invention and it should be understood that the inventive step of the present invention is by no means undermined by the reason that the means adopted for solving the problems, as such, is simple.

Reference to the α-ray emission level of aluminum nitride is found in "Recent Advance and Application of ALN Ceramics", New Ceramics, Vol. 11, No. 9, 1998, but no description and, for that matter even a suggestion, is found about its use in the equipment for semiconductor manufacture. Therefore, said reference does not depreciate the novelty or inventive step of the present invention.

In the present invention, the thickness of the ceramic substrate is preferably 0.5 to 50 mm. If the thickness is less than 0.5 mm, the reduced strength will increase the risk for breakage. On the other hand, if the thickness exceeds 50 mm, the poor transfer of heat will sacrifice the heating efficiency. Incidentally, the substrate thinner than 50 mm and thus having smaller heat capacity is superior in the response to the temperature rising and temperature dropping, in other word, susceptible to the change of heat conductivity. Thus, the present invention is preferred.

The ceramic substrate is preferably free of pores but, if it is porous, the porosity rate is preferably not greater than 5% and the maximum pore diameter is preferably not more than 50 μm. Since the air exists in the pore, if these limits are exceeded, the α-rays passing through the air entrapped in the pores produce a plasma to reduce the insulation resistance at a temperature of 100° C. or more, especially at high temperature (200° C. to 1000° C.).

In the present invention, the temperature range where the ceramic substrate is used is higher or lower than the room temperature, that is, the temperature exceeding 25° C., 800° C. or less, from −100° C. to less than 25° C., especially 0° C. or less.

The ceramic substrate according to the present invention is the ceramic substrate for the use of the apparatus for manufacturing the semiconductor and the like and inspecting the manufactured semiconductor and the like mainly at the semiconductor industry. The use thereof includes a ceramic heater (hot plate), an electrostatic chuck, a wafer prober, susceptor and the like.

The above-mentioned ceramic substrate desirably has a temperature-adjusting means, since various treatments needs to be conducted while conducting the heating and the like and thus varying the temperature of the silicon wafer.

The way of equipping the temperature-adjusting means includes the way of embedding the heating elements in the ceramic substrate, or setting the heating elements on the surface thereof, the way of bringing the heating element into contact with the surface of ceramic substrate and the like. In addition, a peltier device may be embedded in the ceramic substrate or may be attached on the surface thereof. Further, the way of setting a pipe or a flowing line for letting the medium for heating and cooling flow in the ceramic substrate or the way of bringing the medium into contact with the surface of the ceramic substrate may be adopted.

Hereinafter, the present invention is described with reference to each use.

The ceramic heater of the present invention is for heating a semiconductor and comprises a ceramic substrate and a heating element disposed on the surface or internally thereof, wherein the level of α-rays radiated from the surface of said ceramic substrate exceeds 0.25 c/cm$^2$·hr and is not higher than 50 c/cm$^2$·hr.

In the ceramic heater of the present invention, the level of α-rays radiated from the silicon wafer-heating face is not higher than 50 c/cm$^2$·hr. Thus, the substrate is free from the disadvantage that the α-rays damage and cut the covalent bond of the compound which constitutes the ceramic. Thus, the thermal conductivity does not change with passage of time with a consequent result that the accurate temperature control can always be realized.

In the present invention, ideally the level of α-ray emission is equal to nil but it is optimal to set the level to not higher than 0.25 c/cm2·hr in consideration of: controllability thereof; removal of free particles; prevention of error of the inspection; and ensuring of the chucking power of the electrostatic chuck. However, the cost to remove the radioactive nuclide becomes expensive, thus the level of α-rays is adjusted depending on which to priorize the performance thereof or cost.

On the other hand, if the emission level of α-rays exceeds 0.025 c/cm$^2$·hr, by adopting the shearth-type thermocouple, which is prepared by sealing the temperature measurement probes such as thermocouple and the like together with powder of silica, alumina, magnesia and the like in the pipe-like body made of metal or insulating material, the measurement error according to the α-rays can be reduced. In addition, the thermocouple may be fixed by the electrically conductive solder material and the like.

Further, in the case that it is used as a wafer prober, the measurement can be conducted 2 or more times to eliminate the error according to the α-rays. In terms of probability, the error according to the α-rays occur once independently. Thus, if the judgment of being defective is not announced 2 or more consecutive times, the product is judged to be acceptable.

The charge generated when α-rays transmit through the silicon wafer can be reduced by spraying ionic gas, and thus the generation of the free particles can be suppressed.

Ionic gas is produced by, for instance, conducting discharge between the carbon electrodes and sending the air between the electrodes to ionize nitrogen or oxygen in the air. Then, the produced ionic gas is sprayed on the wafer or the ceramic heater. However, this procedure requires a large scale equipment which includes discharging equipment and thus expensive. Accordingly, in consideration of the performance required for the ceramic heater, the cost for ceramic heater and the cost for the equipment, either of: the way of reducing the α-rays amount of the ceramic itself; or the way of utilizing the equipment, is selected.

The cause of α-rays is the radioactive U and Th in the starting material alumina or silica for the nitride or the carbide. Therefore, U and Th are removed from the starting material alumina and silica and the objective nitride ceramics are synthesized by, for example, the reductive nitriding method.

The method of removing U and Th may be a process which, as described in "Synopsis of Lectures at Association of Powder Metallurgy, p. 114, Spring 1980", comprises impregnating a porous γ-FeO$_3$ powder having a mean particle diameter of 2 to 3 μm with an alcoholic solution of titanium isopropoxide, hydrolyzing the alkoxide to use as a U adsorbent to be dispersed in a starting material solution.

For example, the subsequent process comprises dispersing the U adsorbent in an aqueous solution of sodium aluminate derived from bauxite (Al$_2$O$_3$) to let U be adsorbed under basic conditions, separating the adsorbent, converting the sodium aluminate to aluminum hydroxide and to be precipitated, then drying and firing it to give alumina.

While only U is discussed in the literature, the inventors found a similar effect for Th.

The alumina etc. thus obtained are nitrided by the reductive nitriding method. The reductive nitriding method comprises reducing SiO$_2$ and Al$_2$O$_3$ with carbon, such as carbon black, and simultaneously reacting them with nitrogen gas.

Though Japanese Kokai Publication Hei-9-48668 discloses a sintered aluminum nitride for semiconductor production apparatuses as synthesized by a direct nitriding method or an indirect nitriding method, the literature does not refer to the starting material alumina. Moreover, because U and Th are derived from bauxite, the amounts of U and Th cannot be reduced by the mere direct nitriding method.

The ceramic heater of the present invention is a ceramic heater for heating semiconductor wafers and comprises a heating element on the surface or internally of a ceramic substrate.

Figure 2:
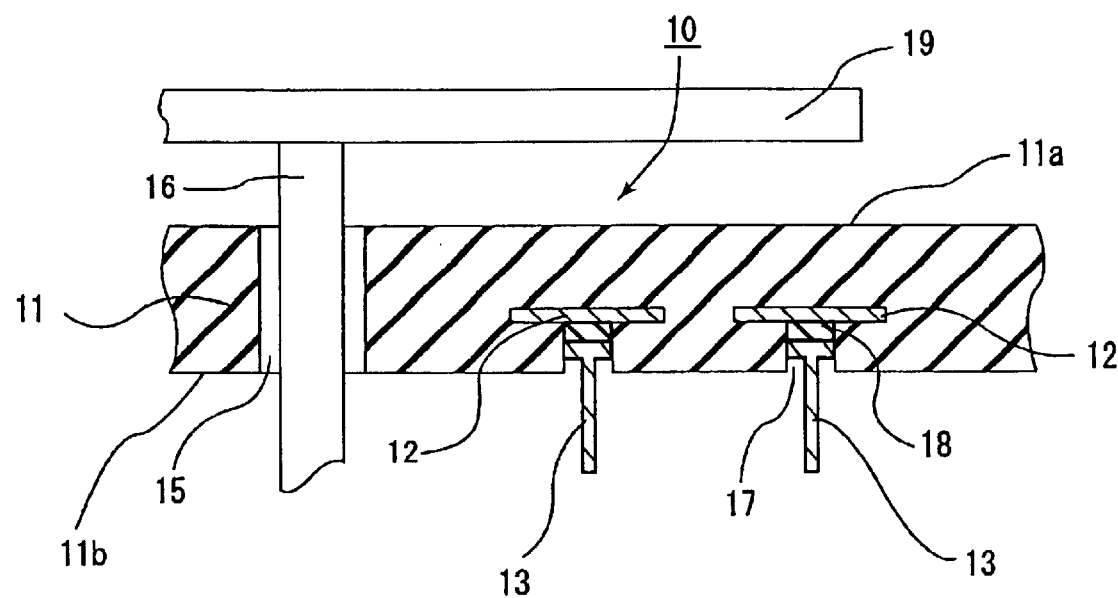
FIG. 2 is a schematic cross-section view showing a portion of the ceramic heater illustrated in FIG. 1.

FIG. 1 is a schematic planer view showing a ceramic heater of the invention and FIG. 2 is a partial section view of the same on exaggerated scale.

The ceramic substrate (hereinafter may be referred to as heater plate as well) 11 is prepared in the form of a disk and a resistance heating element 12 is formed internally of said heater plate 11 in a concentric circular pattern so that the wafer-heating surface (top side) of the heater plate 11 may be uniformly heated all over. Moreover, the resistance heating element 12 comprises a plurality of circular patterns with each two adjacent circles being coupled to form a single wire which is to be connected to external terminals 13, one of which serves as an input terminal with the other serving as an output terminal. In addition, adjacent to its center, the heater plate 11 is further formed with through holes 15 for accepting lifter pins 16 for supporting a semiconductor wafer 19 and further with bottomed holes 14 in which temperature probes are to be embedded.

It should be understood that although the resistance heating element 12 is disposed internally of the heater plate 11 in the ceramic heater 10 illustrated in FIGS. 1 and 2, the resistance heating element 12 may be formed on the bottom surface of the heater plate 11.

The constituent members forming the ceramic heater of the invention are now described in detail.

In the ceramic heater 10 of the present invention, the material of the ceramic substrate (heater plate) which constitutes the heater is not especially limited, but, as described below, the material is preferably a nitride ceramic. This is because nitride ceramics are lower than metals in the coefficient of thermal expansion, and are superior in the mechanical property and they will not easily curl or warp even it is made to be thin, so that a lighter and thinner heater plate 11 can be provided.

Moreover, the heater plate 11 is high in heat conductivity and as thin as 25 mm or less by itself so that the surface temperature of the heater plate 11 quickly follows the change in temperature of the resistance heating element. Thus, by adjusting the voltage and current values to be applied to the resistance heating element, the surface temperature of the heater plate 11 can be easily and accurately controlled.

The ceramics mentioned above include nitride ceramics, oxide ceramics and carbide ceramics but nitride ceramics are particularly suitable.

Since nitride ceramics are high in thermal conductivity and superior in the temperature rise-and-fall characteristic, they are used for the ceramic substrate on which a wafer is directly set or supported in close proximity with its surface.

The nitride ceramic material mentioned above includes aluminum nitride, silicon nitride, boron nitride, titanium nitride and other nitride ceramics. These ceramics can be used independently or in combination.

Among the above species, aluminum nitride is the most preferred because it has the highest heat conductivity of all, namely 180 W/m·K.

Oxide ceramics includes silica, alumina, cordierite, zirconia among others, and carbide ceramics include silicon carbide, titanium carbide, boron carbide, for instance.

The resistance heating element 12 formed on the surface or internally of said heater plate 11 is preferably divided into at least two circuits. By dividing the circuitry, the amount of heat to be generated can be adjusted by controlling the inputs to the respective component circuits, with the result that the temperature of the wafer-heating surface can be accordingly controlled.

The pattern of the resistance heating element 12 may for example be a group of concentric circles, a vortex, a group of eccentric circles, or a serpentine form but the concentric pattern illustrated in FIG. 1 is preferred because a uniform temperature distribution can be obtained over the whole surface of the heater plate.

When the resistance heating element 12 is to be formed on the surface of the heater plate 11, it is preferable to use the method which comprises coating the surface of the heater plate 11 with a conductor containing paste containing a metal particle in a predetermined circuit pattern and sintering the resulting conductor containing paste layer to bake the metal particle on the surface of the heater plate 11. It is sufficient that this sintering be effected to the extent of the metal particles being fused to each other and with the ceramics.

When the resistance heating element is formed on the surface of the heater plate 11, the thickness of the heating element is preferably 1 to 30 $\mu$m, more preferably 1 to 10 $\mu$m. On the other hand, when the resistance heating element is formed internally of the heater plate 11, its thickness is preferably 1 to 50 $\mu$m.

Moreover, when the resistance heating element is formed on the surface of the heater plate 11, the pattern width of the resistance heating element is preferably 0.1 to 20 mm, more preferably 0.1 to 5 mm. When the resistance heating element is formed internally of the heater plate 11, the pattern width of the resistance heating element is 5 to 20 $\mu$m.

The resistance value of the resistance heating element 12 can be freely adjusted by varying the pattern thickness and width but the above-mentioned ranges are most useful for practical purposes. The thinner and finer the resistance heating element pattern is, the greater is its resistance value. The resistance heating element 12 should be greater in thickness and width when it is formed internally of the resistance heater plate 11. When the resistance heating element 12 is formed internally, the distance between the heating surface and the resistance heating element 12 is comparatively short, with the result that the temperature uniformity of the heating surface tends to be poor, thus making it necessary to increase the pattern width of the resistance heating element. Moreover, when the resistance heating element 12 is to be disposed internally, its adhesion to nitride ceramics need not be taken into consideration, so that a high-melting metal such as tungsten or molybdenum or the carbide thereof can be used to increase the resistance. The thickness itself can be increased for the purpose of preventing a disconnection trouble, for instance. From these considerations, the pattern thickness and width of the resistance heating element 12 are preferably controlled within the above-mentioned ranges.

The resistance heating element 12 may be rectangular or elliptic in sectional view but preferably has a flat surface. The flat surface is more efficient in the radiation of heat toward the wafer-heating surface and is less liable to cause a temperature gradient.

The aspect ratio of the cross-section (width of resistance heating element/thickness of resistance heating element) is preferably 10 to 5000.

By controlling said aspect ratio within this range, the resistance value of the resistance heating element 12 can be increased and a temperature uniformity on the heating surface can be insured.

Assuming that the thickness of the resistance heating element 12 is constant, the use of an aspect ratio smaller than the above range leads to a relatively poor propagation of heat from the heater plate 11 in the wafer-heating direction so that a distribution of heat simulating the pattern of the resistance heating element 12 is produced on the heating surface. Conversely, if the aspect ratio is too large, a relatively high temperature will prevail in the area immediately above the center of the resistance heating element 12 so that a thermal distribution more or less simulating the pattern of the resistance heating element 12 is likewise produced on the heating surface. Therefore, in consideration of temperature distribution, the aspect ratio of the cross-section is preferably confined to the range of 10 to 5000.

When the resistance heating element 12 is to be formed on the surface of the heater plate 11, the aspect ratio is preferably 10 to 200 and when the resistance heating element 12 is to be formed internally of the heater plate 11, the preferred aspect ratio is 200 to 5000.

That a larger aspect ratio is preferred when the resistance heating element 12 is formed internally of the heater plate 11 is because, as the resistance heating element 12 is internally disposed, the distance between the heating surface and the resistance heating element 12 is relatively decreased so that the uniformity of surface temperature distribution is also reduced, thus requiring a more flat geometry for the resistance heating element 12.

When the resistance heating element 12 is to be formed in a biased position in thickness direction within the heater plate 11, it is preferably formed in a position close to the surface (bottom surface) opposite to the heating surface of the heater plate 11 and within the range of 50% through 99% of the distance from the heating surface to said bottom surface.

If the amount of offset is less than 50%, the resistance heating element 12 will be too close to the heating surface so that a temperature gradient tends to be formed on the heating surface. Conversely, if the amount of offset is over 99%, the heater plate 11 itself tends to curl to destroy the semiconductor wafer.

Furthermore, when the resistance heating element 12 is formed internally of the heater plate 11, the resistance heating element may comprise a plurality of layers. In this case, the patterns of the respective layers are preferably disposed in mutually complementary relation so that, when viewed from above the wafer-heating surface, the whole resistance heating element 12 can be observed without an overlap over the entire field of view. Typical of such layout is a staggered arrangement of the patterns.

It is also allowable to form the resistance heating element 12 internally of the heater plate 11, with a part of the resistance heating element 12 being exposed.

The conductor containing paste is not particularly restricted but is preferably a composition containing not only the metal particle or conductive ceramic particle required for electrical conductivity but also a resin, a solvent, a thickener and other additives.

The metal particle mentioned above is preferably a powder of, for example, a noble metal (gold, silver, platinum, palladium), lead, tungsten, molybdenum or nickel. These metals can be used singly or in a combination of two or more species. Those metals are comparatively resistant to oxidation and have sufficiently high resistance to generate heat.

The conductive ceramic particle includes tungsten carbide and molybdenum carbide powders. Those powders can be used each independently or in a combination of two or more species.

The preferred particle diameter of said metal or conductive ceramic particle is 0.1 to 100 μm. If the powder is finer than 0.1 μm, it will be ready to be oxidized. On the other hand, if the limit of 100 μm is exceeded, the powder will not be easily sintered and the resistance value will be increased.

The metal particle mentioned above may be spherical or scaly. A mixture of spherical and scaly powders may also be employed.

When the metal particle is scaly or a mixture of spherical and scaly particles, the metal oxide added is held more effectively between the metal particles, with the consequent advantage that a firmer adhesion can be assured between the resistance heating element 12 and the nitride ceramics and that the resistance value can be increased.

The resin for use in the conductor containing paste includes, for example, epoxy resin and phenolic resin. The solvent may for example be isopropyl alcohol. The thickener may for example be cellulose.

As mentioned above, the conductor containing paste is preferably a paste prepared by adding metal oxides to the starting metal particle so that the resistance heating element 12 will be a sintered body composed of the metal and metal oxide powders. Thus, by sintering the metal oxides together with the metal particle, an intimate bond can be realized between the heater plate nitride ceramics and the metal particle.

It remains to be fully clarified as yet why incorporation of metal oxides results in an improved strength of bonding to the nitride ceramics but it may be suggested that since the surface of the metal particles and that of the nitride ceramics have been slightly oxidized and the resulting oxide films are integrally sintered together with the intermediary of the metal oxides added, thus causing an intimate adhesion of the metal particle to the nitride ceramics.

The metal oxides mentioned above are preferably at least one kind of the members selected from the group consisting of lead oxide, zinc oxide, silica, boron oxide ($B_2O_3$), alumina, yttria and titania.

These oxides are capable of improving the adhesion between the metal particle and nitride ceramics without increasing the resistance value of the resistance heating element 12.

The proportions of said lead oxide, zinc oxide, silica, boron oxide ($B_2O_3$), alumina, yttria and titania in each 100 weight parts of the total metal oxide are 1 to 10 (weight parts; the same applies below) for lead oxide, 1 to 30 for silica, 5 to 50 for boron oxide, 20 to 70 for zinc oxide, 1 to 10 for alumina, 1 to 50 for yttria, and 1 to 50 for titania. The total of these oxides is preferably not more than 100 weight parts.

By adjusting the amount of the oxide(s) within the above range, the bonding of the metal particle to nitride ceramics, in particular, can be improved.

The addition amount of said metal oxide(s) relative to the metal particle is preferably not less than 0.1 weight % and less than 10 weight %. Moreover, the area resistivity of the resistance heating element 12 formed by using a conductor containing paste of the above composition is preferably 1 mΩ/□ to 10 Ω/□.

When the resistance heating element 12 is formed on the surface of the heater plate 11, a metal cover layer is preferably formed on the surface of the resistance heating element 12. Because the layer prevents oxidation of the sintered metal and consequent change in resistance value. The thickness of the metal cover layer thus formed is preferably 0.1 to 10 μm.

The metal for use in the formation of said metal cover layer is not particularly restricted only provided that it is anon-oxidizable metal. Thus, it may for example be gold, silver, palladium, platinum or nickel. These metals can be used alone or in a combination of two or more species. Among the metals mentioned above, nickel is particularly preferred.

The resistance heating element 12 must, of course, be provided with terminals for electrical connection to a power source and since these terminals are generally attached to the resistance heating element 12 via a solder, a nickel layer is preferred because it prevents thermal diffusion of the solder. As connecting terminals, external terminals 13 made of Kovar, for instance, can be used.

When the resistance heating element 12 is formed internally of the heater plate 11, the surface of the resistance heating element 12 will not be oxidized and, therefore, need not be covered. When the resistance heating element 12 is formed internally of the heater plate 11, the resistance heating element may be left partially exposed, or may be provided with conductor-filled through holes at its terminal positions for connecting and securing in position said external terminals.

As the solder for use in connecting the external terminals, various alloys such as silver-lead, lead-tin, bismuth-tin, etc. can be used. The preferred thickness of the solder layer is 0.1 to 50 μm. Within this range, firm solder connections can be obtained.

Furthermore, as illustrated in FIG. 2, the heater plate 11 may be provided with through holes 15 so that by inserting pins (not shown) into the through holes 15, the semiconductor wafer may be delivered to a transfer machine (not shown) or received from the transfer machine.

With the ceramic heater of the present invention, the semiconductor wafer can be heated with a clearance of 5 to 500 μm maintained from the ceramic substrate. By providing this clearance, the wafer can be protected more or less from the influence of the surface temperature distribution of the heater plate. In this mode of use, the wafer is supported with support pins which are arranged to the heater plate and heated in the condition that the semiconductor wafer is slightly distanced from the heater plate 11.

Next, the method of manufacturing the ceramic heater of the present invention is now described.

First, the process for fabricating a ceramic heater having a resistance heating element on the bottom surface of a heater plate 11 is described.

(1) Fabrication of a Heater Plate

Powder of nitride ceramic such as aluminum nitride or carbide ceramic such as silicone carbide, which is made to contain reduced quantity of uranium or thorium as described above, is formulated with optional sintering aids, such as yttria, $B_4C$ etc., a binder, and other components to prepare a slurry. This slurry is spray-dried and the resulting granules are placed in a metal mold or the like and compressed into a plate form to provide a raw formed body (green).

When the ceramic heater is to be provided with the function of an electrostatic chuck, a metal foil or the like for electrostatic chucking can be embedded in the raw formed body.

Then, the raw formed body is optionally formed with through holes for accepting said lifter pins for supporting a semiconductor wafer and, further, with bottomed holes in which temperature probes such as thermocouples are to be embedded. Optionally, the above processing may be performed after the sintering operation.

Then, this raw formed body is heated and fired to be sintered and provide a plate-formed body made of ceramic. A heater plate 11 is then prepared by machining this plate-formed body. As an alternative, the plate-formed body may be fabricated to the specified size so that it may directly be used as the heater plate 11 after firing. Then, by conducting a heating and firing operation under pressure, a porosity-free heater plate 11 can be fabricated. The heating temperature may be any suitable temperature not less than the sintering point of the ceramics but, in the case of nitride ceramics, a temperature within the range of 1000 to 2500° C. is used.

(2) Printing the Heater Plate with a Conductor Containing Paste

The conductor containing paste is generally a highly viscous fluid comprising a metal particle, a resin and a solvent. The conductor containing paste layer is formed by printing the body with said conductor containing paste in the pattern corresponding to a resistance heating element by the screen printing technique, for instance. Since the resistance heating element is required to set the heater plate at a uniform temperature over its whole surface, it is preferably printed in a concentric circular pattern as illustrated in FIG. 1.

It is preferable that the conductor containing paste layer be formed in such a manner that the resistance heating element 12 after sintering will have a rectangular section and a flat surface.

Incidentally, since a carbide ceramic may have electric conductivity, firstly insulation layer such as an oxide layer is formed on the surface thereof and then the conductor containing paste is printed on the insulation layer.

(3) Firing the Conductor Containing Paste

The conductor containing paste layer printed on the bottom surface of the heater plate 11 is heated and fired to remove the resin and solvent, to sinter the metal particle onto the bottom surface of the heater plate 11, and thereby to form a resistance heating element 12. The heating temperature is preferably 500 to 1000° C.

When said metal oxide(s) have been incorporated in the conductor containing paste, the metal particle, heater plate and metal oxide(s) are integrally sintered to provide an improved bond between the resistance heating element and heater plate.

(4) Formation of a Metal Cover Layer

The surface of the resistance heating element 12 is preferably provided with a metal covering layer. This is to prevent: the change of the resistance value of the resistance heating element 12 based on the oxidation thereof; or the deterioration thereof based on the oxidation thereof. The metal cover layer can be formed by, for example, electrolytic plating, electroless plating or sputtering but, for mass production, electroless plating is the most suitable of all.

(5) Attaching Terminals Etc.

To ends of each circuit pattern constituting the resistance heating element 12, terminals (external terminals 13) for electrical connection to a power source are attached by soldering and the like. In addition, thermocouples are inserted into the bottomed holes 14 and secured in situ with a silver or gold brazing material and further sealed with a heat-resistant resin such as a polyimide resin to complete the manufacture of a ceramic heater.

The method of manufacturing a ceramic heater (FIGS. 1 and 2) having a resistance heating element 12 internally of a heater plate 11 is now described.

(1) Fabrication of a Heater Plate

First, Powder of nitride ceramic such as aluminum nitride or carbide ceramic such as silicone carbide, which is made to contain reduced quantity of uranium or thorium as described above, is mixed with the binder, solvent, etc. to prepare a paste, and using the paste, a green sheet is formed.

The nitride ceramic powder as mentioned above includes an aluminum nitride powder, and where necessary, sintering aids such as yttria may be added.

As the carbide ceramic powder, silicone carbide and the like can be used, and C or $B_4C$ and the like can be added based on the necessity. The binder is preferably at least one member selected from the group consisting of acrylic binder, ethylcellulose, butylcellosolve and polyvinylal.

The solvent is preferably at least one member selected from the group consisting of α-terpineol and glycol.

The paste obtained by compounding those components is molded by the doctor blade method to provide said green sheet.

The preferred thickness of the green sheet is 0.1 to 5 mm.

Then, where necessary, the green sheet is formed with means serving as through holes 15 for accepting lifer pins for supporting a semiconductor wafer, means serving as bottomed holes in which temperature probes such as thermocouples are to be embedded, and means serving as conductor-filled through holes 18 for connecting the resistance heating element to external terminals. This processing may be carried out after formation of a green sheet laminate to be described below or after sintering of the laminate.

(2) Printing the Green Sheet with the Conductor Containing Paste

On the green sheet, the conductor containing paste containing a metal or conductive ceramic particle is printed.

In this step, not only the conductor containing paste layer for the resistance heating element but also the conductor containing paste layer necessary for fabrication of the electrostatic chuck can be formed.

The conductor containing paste contains a metal or conductive ceramic particle.

The mean particle diameter of tungsten or molybdenum powder is preferably 0.1 to 5 $\mu$m. If the mean particle diameter is less than 0.1 μm or over 5 μm, the printability of the conductor containing paste will be unsatisfactory.

The conductor containing paste may for example be a composition (paste) comprising 85 to 87 weight parts of a metal or conductive ceramic particle, 1.5 to 10 weight parts of at least one kind of binder selected from the group consisting of acrylic binder, ethylcellulose, butylcellosolve and polyvinylal, and 1.5 to 10 weight parts of at least one kind of solvent selected from the group consisting of α-terpineol and glycol.

(3) Laminating Green Sheets

The green sheets not printed with the conductor containing paste are laminated on both sides of the green sheet printed with the conductor containing paste.

In this step, it is arranged so that the number of green sheets to be laminated on the top side is larger than the number of green sheets to be laminated on the bottom side so that the resistance heating element will be located closer to the bottom side.

Specifically, the preferred number of green sheets to be laminated is 20 to 50 on the top side and 5 to 20 on the bottom side.

(4) Sintering the Green Sheet Laminate

The green sheet laminate is hot-pressed to sinter the green sheets and the conductor containing paste within the laminate.

The heating temperature is preferably 1000 to 2000° C. and the pressure to be applied is preferably 100 to 200 kg/cm². The heating operation is performed in an inert gas atmosphere. The inert gas may for example be argon gas or nitrogen gas.

The bottomed holes for accepting temperature probes may be formed after this sintering operation. The bottomed holes can be formed by blasting, e.g. sandblasting, after surface polishing. In addition, terminals are attached to the conductor-filled through holes for connection to the internal resistance heating element, followed by heating for reflow. The heating temperature is preferably 200 to 500° C.

Then, thermocouples as temperature probes are secured in position with a silver or gold brazing material and sealed with a heat-resistant resin such as polyimide resin to complete the manufacture of a ceramic heater.

The electrostatic chuck of the present invention is now described.

The electrostatic chuck of the present invention comprises a nitride ceramic substrate and electrodes embedded therein, wherein the level of α-rays radiated from the semiconductor wafer heating face of said ceramic substrate exceeds 0.25 c/cm²·hr and is not higher than 50 c/cm²·hr.

The nitride ceramic substrate constituting this electrostatic chuck of the present invention comprises the same material as the ceramic heater of the present invention hereinbefore, and also manufactured in the same manner. Thus, the level of α-rays radiated from the wafer-mounting surface substantially exceeds 0.25 c/cm²·hr and is not higher than 50 c/cm²·hr. As a consequence, the change of the thermal conductivity based on the α-rays with passage of time is suppressed and the accurate temperature control can be made possible, thus, the change of the absorption power with passage of time in accordance of the Johnson-Rahbeck effect can be prevented.

In addition, the change of thermal conductivity based on the α-rays is suppressed even in the low temperature of −100 to 0° C. Thus, the chuck is superior in: the evenness of the temperature distribution; and response to the temperature rising and temperature dropping, thus the change of chucking power with passage of time can be prevented.

FIG. 3(a) is a schematic longitudinal section view of the electrostatic chuck and (b) is a horizontal sectional view of electrostatic electrodes embedded in the same of the present invention.

This electrostatic chuck comprises a ceramic substrate 21, chuck positive electrode static layer 22 and chuck negative electrode static layer 23, disposed internally of said ceramic substrate 21, and a 5 to 2000 μm-thick ceramic dielectric film 25 formed on said electrodes.

Figure 3:
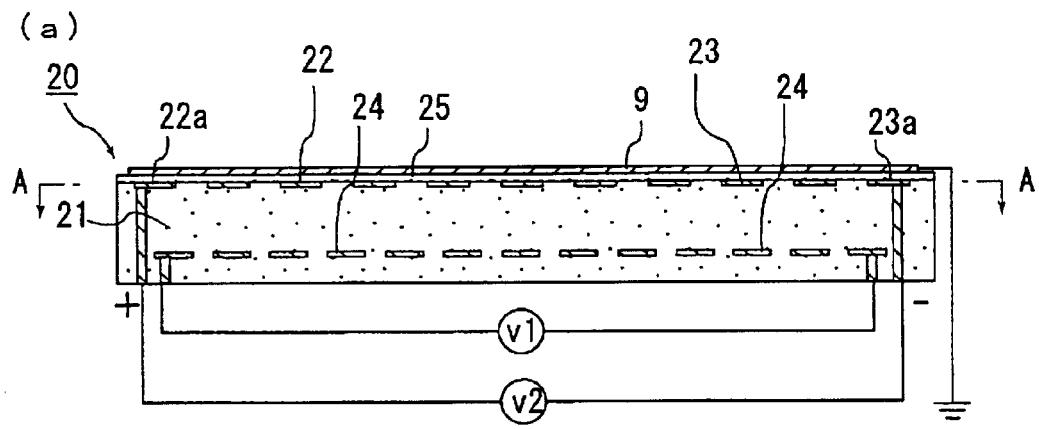
FIG. 3(a) is a schematic longitudinal section view of the electrostatic chuck according to the invention and (b) is a horizontal sectional view of electrostatic electrodes embedded in the same of the present invention.
Figure 3:
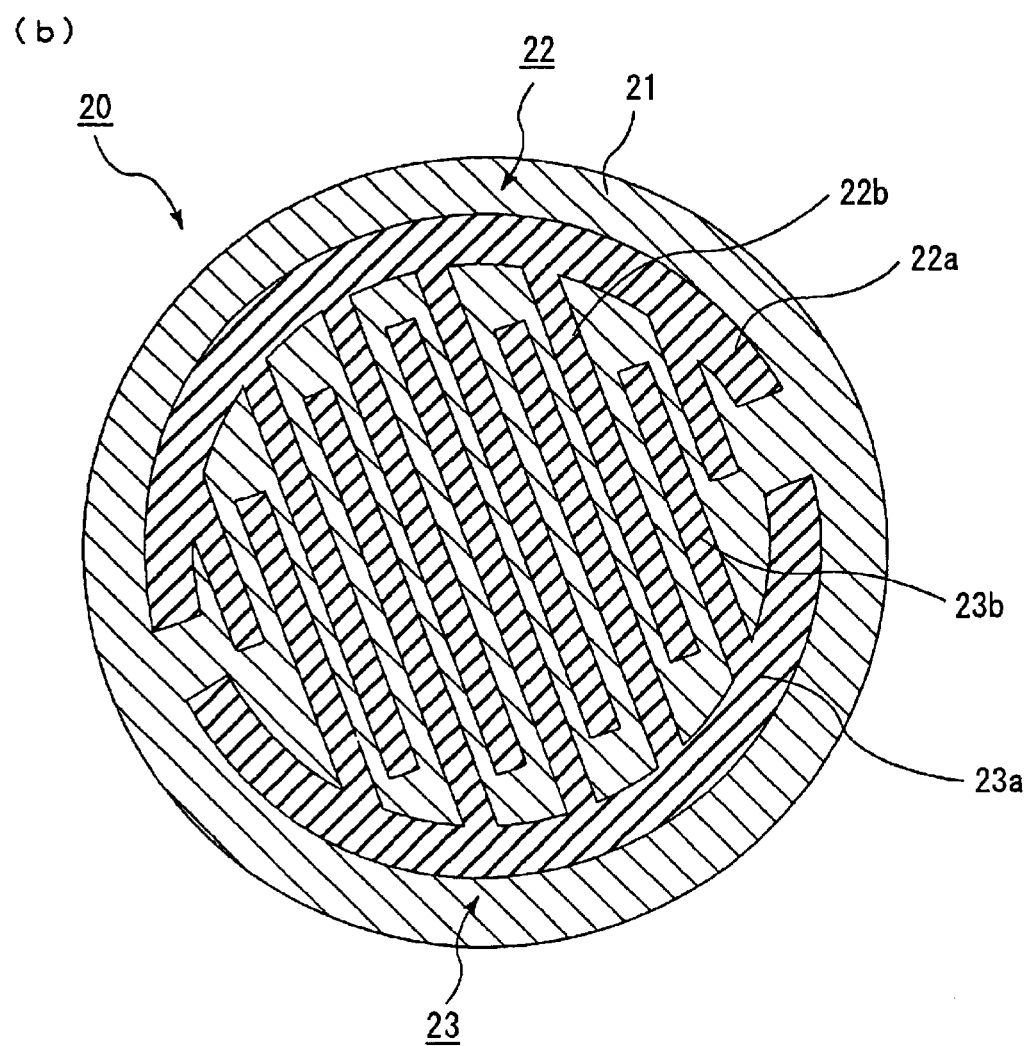

The electrostatic chuck is usually formed in a circular configuration in plan view as is the case of the ceramic heater, and disposed internally of the ceramic substrate 21 are the chuck positive electrode static layer 22 comprising a semi-circular segment 22a and a comb-shaped segment 22b and the chuck negative electrode static layer 23 similarly comprising a semi-circular segment 23a and a comb-shaped segment 23b, the two layers 22 and 23 being arranged face-to-face in such a manner that the teeth of the two comb-shaped segments 22b, 23b are in staggered relation as shown in Fig. 3.

For operating this electrostatic chuck, the chuck positive electrode static layer 22 and chuck negative electrode static layer 23 are connected to the + and − terminals, respectively, and a DC source and charged. Thereupon, the semiconductor wafer set on the electrostatic chuck is attracted by static electricity.

In this electrostatic chuck, the resistance heating element may be embedded internally of the ceramic substrate 21 or on the surface thereof. In the electrostatic chuck 20 shown in FIG. 3, the resistance heating element 24 may be embedded internally of the ceramic substrate 21.

The method of manufacturing the above electrostatic chuck is substantially identical to the method of manufacturing the ceramic heater except that the surface of said green sheet is coated with a conductor containing paste in the configurations of the chuck positive electrode static layer 22 and chuck negative electrode static layer 23 or a metal foil is embedded according to the patterns of said chuck positive electrode static layer 22 and chuck negative electrode static layer 23.

The substrate for a wafer prober of the present invention is now explained.

A substrate for a wafer prober of the present invention comprises a ceramic substrate and a conductor layer formed on the surface thereof, wherein the level of α-rays radiated from the surface of said ceramic substrate exceeds 0.25 c/cm²·hr and is not higher than 50 c/cm²·hr.

Thus, the drop of the thermal conductivity of the ceramic substrate with passage of time is suppressed with the result that judgment errors in the conduction test owing to the poor temperature control can be precluded.

In the substrate for wafer prober of the present invention, the chuck top conductor layer 2 is formed on the surface of the ceramic substrate. (reference to FIG. 5(g))

The conduction test is performed by setting a wafer on the chuck top conductor layer and pressing a probe card carrying tester pins against the wafer. The noble metal layer formed on the chuck top conductor layer 2 does not interfere with the current conduction to the reverse side of the wafer and prevents diffusion of boron and phosphorus in the chuck top conductor layer and of yttria, sodium etc. in the ceramics. The noble metal is preferably at least one member selected from among gold, silver, platinum and palladium.

Because the substrate for the wafer prober of the present invention is based on a ceramic substrate of high rigidity, the chuck top is not caused to curl even if it is pressed by the tester pins of the probe card so that the chuck top layer may be made smaller in thickness than the case of the metal substrate.

Moreover, because the chuck top may be designed to be smaller in thickness than the case of the metal substrate, the heat capacity may be reduced even though the heat conductivity of ceramics is low as compared with metals as the outcome, so that the temperature rise-and-fall characteristic can be improved.

The preferred thickness of said chuck top conductor layer is 1 to 10 µm. If it is less than 1 µm, the layer will be too high in resistance to function as an electrode. On the other hand, if the limit of 10 µm is exceeded, the layer tends to peel off due to the strain in the conductor.

For the formation of the chuck top conductor layer, at least one metal selected from among high-melting metals such as copper, titanium, chromium, nickel, noble metals (gold, silver, platinum, etc.), tungsten, molybdenum, etc. can be used.

Preferably, the chuck top conductor layer contains nickel, for this metal is high in hardness and is not easily deformed by the pressure of tester pins.

The substrate for the wafer prober according to the present invention is, as shown in Fig. 5(g), preferably equipped with a guard electrode 5 and a ground electrode 6 as embedded in the ceramic substrate. The guard electrode 5 is intended to cancel stray capacitance in the measuring circuit, and the earth potential of the measuring circuit (that is the chuck top conductor layer) is applied thereto. The ground electrode 6 is intended to cancel the noise from the temperature control means.

The chuck top conductor layer-formed surface of the substrate for the wafer prober according to the present invention is preferably formed with grooves 2 and air suction holes 8. In this arrangement, the wafer can be attracted by setting the wafer and withdrawing air through the suction holes.

BEST MODE FOR CARRYING OUT THE INVENTION

The present invention is now described in further detail.

EXAMPLE OF SYNTHESIS

Synthesis of Aluminum Nitride (1) A porous γ-$Fe_2O_3$ powder with a mean particle diameter of 3 µm was impregnated with a 10 weight % ethanolic solution of titanium isopropoxide containing 0.5 weight % of HCl and allowed to stand for hydrolysis at 25° C. for 24 hours to provide a U/Th adsorbent.

(2) In a Teflon vessel, 1000 weight parts of pulverized bauxite was mixed with a 10% aqueous solution of sodium hydroxide, and the mixture was treated in an autoclave at 190° C. for 5 hours. The reddish sludge was filtered off to recover an aqueous solution of sodium aluminate.

(3) This aqueous solution of sodium aluminate was adjusted to pH 12 with 1N-HCl and the above adsorbent was dispersed therein at 50° C. for 0.5 hour under vibration.

(4) The adsorbent was filtered off and the filtrate was adjusted to pH 8.5 with hydrochloric acid to cause aluminum hydroxide to separate out. The precipitate was rinsed with distilled water, dried at 80° C. for 5 hours, and fired in the air at 1000° C. to provide alumina.

(5) One-thousand (1000) weight parts of the alumina prepared instep (4) was mixed with 353 weight parts of graphite and reacted in a nitrogen gas stream at 1950° C. for 5 hours. Then, the unreacted C was oxidized and removed at 350° C. to give aluminum nitride.

(6) This aluminum nitride was pulverized in a ball-mill and size-selected with a pneumatic classifier to provide a powder having a mean particle diameter of 1.1 µm.

The U and Th contents of the powder are 650 ppb and 30 ppb, respectively, the measurement was conducted by ICP-MS method.

Example 1

Manufacture of a Ceramic Heater Having a Heating Element on Its Surface (1) A composition comprising 100 weight parts of the above-mentioned aluminum nitride powders having a mean particle diameter of 1.1 µm, 4 weight parts of yttria (mean particle dia.: 0.4 µm), 12 weight parts of acrylic binder and the balance of alcohol was spray-dried to prepare a granular powder.

(2) This granular powder was set in a metal mold and formed into a raw formed body.

(3) The raw formed body subjected to the above-mentioned processing was then hot-pressed at 1800° C. and 200 kg/$cm^2$ to provide a 3 mm-thick aluminum nitride board.

From this board, a disk having a diameter of 210 mm was cut out to provide a ceramic disk (heater plate). This heater plate was drilled to form the through holes for accepting lifter pins for supporting a semiconductor wafer and the bottomed holes for embedding thermocouples (diameter; 1.1 mm, depth: 2 mm).

(4) On the heater plate processed in (3) above, a conductor containing paste was applied by screen printing. The printing pattern was a concentric circular pattern as shown in FIG. 1.

The conductor containing paste used was Solbest PS603D available from Tokuriki Kagaku Kenkyusho, which is in common use for the formation of plated-through holes in printed circuit boards.

This conductor containing paste is a silver-lead paste containing, based on 100 weight parts of silver, 7.5 weight parts of metal oxide comprising lead oxide (5 wt. %), zinc oxide (55 wt. %), silica (10 wt. %), boron oxide (25 wt. %) and alumina (5 wt. %). The silver powder was a scaly powder having an average particle diameter of 4.5 µm.

(5) The heater plate printed with the conductor containing paste as above was then heated at 780° C. to sinter the silver and lead in the conductor containing paste and bake them onto the heater plate 11 to form a resistance heating element 12. The resistance heating element composed of silver and lead was 5 µm thick×2.4 mm wide and had an area resistivity of 7.7 mΩ/□.

(6) The heater plate 11 thus fabricated in (5) above was dipped in an electroless plating bath comprising an aqueous solution of nickel sulfate: 80 g/l, sodium hypophosphite: 24 g/l, sodium acetate: 12 g/l, boric acid: 8 g/l and ammonium chloride: 6 g/l to deposit a 1 µm-thick metal cover layer (nickel layer) on the surface of the silver-lead resistance heating element 12.

(7) The parts to which terminals are to be attached for electrical connection to a power source are printed with a silver-lead soldering paste (manufactured by Tanaka Noble Metals) by the screen printing technique to form a solder layer.

On the solder layer, external terminals of Kovar were placed, followed by heating for reflow at 420° C. In this manner, the external terminals were rigidly secured to the surface of the resistance heating element.

(8) Thermocouples for temperature control were secured in position with a 81.7 Au-18.3 Ni gold brazing material (fusion by heating at 1030° C.) to provide a ceramic heater.

Example 2

(1) A composition made of 100 parts by weight of SiC powder (average particle diameter: 0.3 μm, Diasix Super Fine GC-15 made by Yakushima Denko Co.) from which U and Th were removed in the same way as in Example of synthesis, 0.5 part by weight of $B_4C$ as a sintering aid, 12 parts by weight of an acrylic binder and an alcohol was subjected to spray-drying to make granular powder. The amount of the content of U and Th in the SiC powder were small, and the content of U was about 800 ppb, and that of Th was about 50 ppb. This is primarily used in a ceramic filter for collecting particles in a diesel engine.

(2) Next, this granular powder was put into a mold and formed into a flat plate form to obtain a raw formed body (green).

(3) The raw formed body subjected to the processing treatment was hot-pressed at 2100° C. and a pressure of 180 kg/cm² to obtain a plate made of SiC and having a thickness of 3 μm.

Next, this plate was cut out from its surface into a disk having a diameter of 210 mm to prepare a heater plate.

Next, this heater plate was coated with a glass paste (G-5232, made by Shoei Chemical Industries Co., Ltd.), and was fired at 1000° C. for 1 hour to form a $SiO_2$ film having a thickness of 2 μm on the surface of the heater plate made of SiC.

Next, this heater plate was drilled to make through holes into which supporting pins for a silicon wafer would be inserted, and bottomed holes (diameter: 1.1 mm, depth: 2 mm) into which thermocouples would be embedded.

(4) A conductor containing paste was printed on the heater plate obtained in the above-mentioned (3) by screen printing. The printed pattern was a concentric circular pattern as illustrated in FIG. 1.

This pattern was divided into 9 pattern pieces. Each of the first to third pieces, the fourth to sixth pieces, and the seventh to ninth pieces, when counted from the outside, was made up to a single control section. Each of the control sections would be subjected to temperature control.

The conductor containing paste was made of 90 parts by weight of scaly silver (Ag-540, made by Shoei Chemical Industries Co., Ltd.), 10 parts by weight of platinum in an acicular crystal form (Pt-401, made by Shoei Chemical Industries Co., Ltd.), 7.5 parts by weight of silica, 1.5 parts by weight of boron oxide, 6parts by weight of zincoxide, and 30 parts by weight of cellulose acetate as an organic vehicle.

(5) Next, the heater plate on which the conductor containing paste was printed was heated and fired at 780° C. to sinter silver and platinum in the conductor containing paste and bake them onto the heater plate. Thus, resistance heating elements were formed. The resistance heating elements had a thickness of 5 μm, a width of 10 mm and an area resistivity of 0.13 Ω/□.

(6) Next, the heater plate formed in the above-mentioned (5) was immersed into an electroless nickel plating bath consisting of an aqueous solution containing 80 g/L of nickel sulfate, 24 g/L of sodium hypophosphite, 12 g/L of sodium acetate, 8 g/L of boric acid, and 6 g/L of ammonium chloride, to precipitate a metal covering layer (nickel layer) having a thickness of 1 μm on the surface of the silver-lead resistance heating elements 12.

(7) By screen printing, a silver-lead solder paste (made by Tanaka Noble Metal) was printed on portions to which terminals for ensuring connection to a power source would be attached, so as to form a solder layer.

Next, external terminals made of Kovar were put on the solder layer and heated and reflowed at 420° C. to attach the external terminals onto the surfaces of the resistance heating elements.

(8) Sheath-type thermocouples for controlling temperature were inserted into the bottomed holes, and a ceramic adhesive agent (Aron Ceramic, made by Toa Gosei Co., Ltd.) was embedded in the holes to fix the thermocouples. In this way, a ceramic heater was obtained.

As the sheath-type thermocouple, a product: wherein a K-type thermocouple together with 50% by weight of MgO and 50% by weight of SiO were put into a stainless steel tube in the state that they did not contact each other; and in which the tube was sealed, was used.

Example 3

(1) A composition made of 100 parts by weight of alumina powder (average particle diameter: 0.5 μm, and purity: 99.99%, made by Union Carbide) from which U and Th were removed in the same way as in Example of synthesis, 12 parts by weight of an acrylic binder and an alcohol was subjected to spray-drying to make granular powder. In this alumina, the amount of the content of U was about 1.25 ppm, and that of Th was about 0.1 ppm. This is primarily used as the raw material of an IC substrate.

(2) Next, this granular powder was put into a mold and formed into a flat plate form to obtain a raw formed body (green).

(3) The raw formed body subjected to the processing treatment was hot-pressed at 1600° C. and a pressure of 180 kg/cm² to obtain a plate having a thickness of 3 mm and made of alumina.

Next, this plate was cut out from its surface into a disk from having a diameter of 210 mm to prepare a heater plate.

Next, this formed body was drilled to make portions which would be through holes into which supporting pins for a silicon wafer would be inserted, and portions which would be bottomed holes 14 (diameter: 1.1 mm, depth: 2 mm) into which thermocouples would be embedded.

(4) A conductor containing paste was printed on the heater plate obtained in the above-mentioned (3) by screen printing. The printed pattern was a concentric circular pattern as illustrated in FIG. 1.

This pattern was divided into 9 pattern pieces. Each of the first to third pieces, the fourth to sixth pieces, and the seventh to ninth pieces, when counted from the outside, was made up to a single control section. Each of the control sections would be subjected to temperature control.

As the conductor containing paste, the following composition was used: 90 parts by weight of scaly silver (Ag-540, made by Shoei Chemical Industries Co., Ltd.), 10 parts by weight of platinum in an acicular crystal form (Pt-401, made by Shoei Chemical Industries Co., Ltd.), 7.5 parts by weight of silica, 1.5 parts by weight of boron oxide, 6 parts by weight of zinc oxide, and 30 parts by weight of cellulose acetate as an organic vehicle.

(5) Next, the heater plate on which the conductor containing paste was printed was heated and fired at 780° C. to sinter silver and platinum in the conductor containing paste and bake them onto the heater plate. Thus, resistance heating elements were formed. The resistance heating elements had a thickness of 5 μm, a width of 10 mm and an area resistivity of 0.13 Ω/□.

(6) Next, the heater plate formed in the above-mentioned (5) was immersed into an electroless nickel plating bath consisting of an aqueous solution containing 80 g/L of nickel sulfate, 24 g/L of sodium hypophosphite, 12 g/L of sodium acetate, 8 g/L of boric acid, and 6 g/L of ammonium chloride, to precipitate a metal covering layer (nickel layer) having a thickness of 1 µm on the surface of the silver-lead resistance heating elements.

(7) By screen printing, a silver-lead solder paste (made by Tanaka Noble Metal) was printed on portions to which terminals for ensuring connection to a power source would be attached, so as to form a solder layer.

Next, external terminals made of Kovar were put on the solder layer and heated and reflowed at 420° C. to attach the external terminals onto the surfaces of the resistance heating elements.

(8) Sheath-type thermocouples for controlling temperature were inserted into the bottomed holes, and a ceramic adhesive agent (Aron Ceramic, made by Toa Gosei Co., Ltd.) was embedded in the holes to fix the thermocouples. In this way, a ceramic heater was obtained.

Example 4

The present example was basically the same as Example 2. However, the heater plate made of SiC was not manufactured and $SiO_2$ (Quarts Light, made by Denki Kagaku Kogyo Kabushiki Kaisha) was used, instead. $SiO_2$ was subjected to treatment for removing U and Th in the same way as in Example of synthesis. The content of U was about 2.5 ppm, and that of Th was about 0.2 ppm. This is primarily a material used in a buffer plate. This $SiO_2$ powder was hot-pressed at 1600° C. and at 200 kg/cm$^2$ to prepare a $SiO_2$ substrate.

Example 5

Manufacture of an Electrostatic Chuck Internally Provided with a Heating Element and Static Electrodes for the Electrostatic Chuck (1) A paste was prepared by compounding 100 weight parts of above-mentioned aluminum nitride powders in Example 1 with 4 weight parts of yttria (average particle diameter: 0.4 µm), 11.5 weight parts of acrylic binder, 0.5 weight part of dispersant and 53 weight parts of alcohol (1-butanol and ethanol), and using the paste a 0.47 mm-thick green sheet was molded by the doctor blade method.

(2) This green sheet was dried at 80° C. for 5 hours and punched to form through holes 15 serving as semiconductor wafer-support pin-accepting holes, 1.8 mm, 3.0 mm and 5.0 mm in diameter, and those serving as conductor-filled through holes 18 for electrical connection to external terminals.

(3) A conductor containing paste A was prepared by compounding 100 weight parts of a tungsten carbide powder having a mean particle diameter of 1 µm, 3.0 weight parts of acrylic binder, 3.5 weight parts of the solvent α-terpineol, and 0.3 weight part of dispersant.

A conductor containing paste B was prepared by compounding 100 weight parts of a tungsten powder having a mean particle diameter of 3 µm, 1.9 weight parts of acrylic binder, 3.7 weight parts of the solvent α-terpineol, and 0.2 weight part of dispersant.

Using this conductor containing paste A, a conductor containing paste layer was formed on the green sheet by screen printing as shown in FIG. 1. The printing pattern was a concentric circular pattern. On another green sheet, a conductor containing paste layer was formed according to the static electrode pattern illustrated in FIG. 3.

In addition, the through holes serving as conductor-filled through holes for connecting external terminals were filled with the conductor containing paste B.

The green sheet on which the conductor containing paste was printed in the pattern of the concentric circles by the above processing was laminated with 37 and 13 units of green sheet not printed with the tungsten paste on the top (heating surface) and bottom sides, respectively. The laminating temperature and pressure were 130° C. and 80 kg/cm$^2$.

(4) The above laminate was degreased in a nitrogen gas atmosphere at 600° C. for 5 hours and hot-pressed at 1890° C. and 150 kg/cm$^2$ for 3 hours to provide a 3 mm-thick aluminum nitride plate. From this plate, a disk 230 mm in diameter was cut out to provide a ceramic substrate internally provided with a 6 µm-thick×10 mm-wide resistance heating element and static electrodes.

(5) The ceramic substrate obtained in (4) was polished with a diamond wheel, and with a mask set in position, its surface layer was formed with bottomed holes (diameter: 1.2 mm, depth: 2.0 mm) for accepting thermocouples by sandblasting with SiC or the like.

(6) The through holes for conductor-filled through holes were partially bored to form recesses, in which external terminals made of Kovar were secured in position with a gold brazing material composed of Ni—Au alloy under heating for reflow at 700° C.

The mode of connection of said external terminals is preferably a 3-point tungsten support system, because said system is high in connection reliability.

(7) Then, a plurality of sheath-type thermocouples for temperature control were embedded in the bottomed holes to complete the manufacture of a ceramic heater having an electrostatic chuck function.

Example 6

Figure 4:
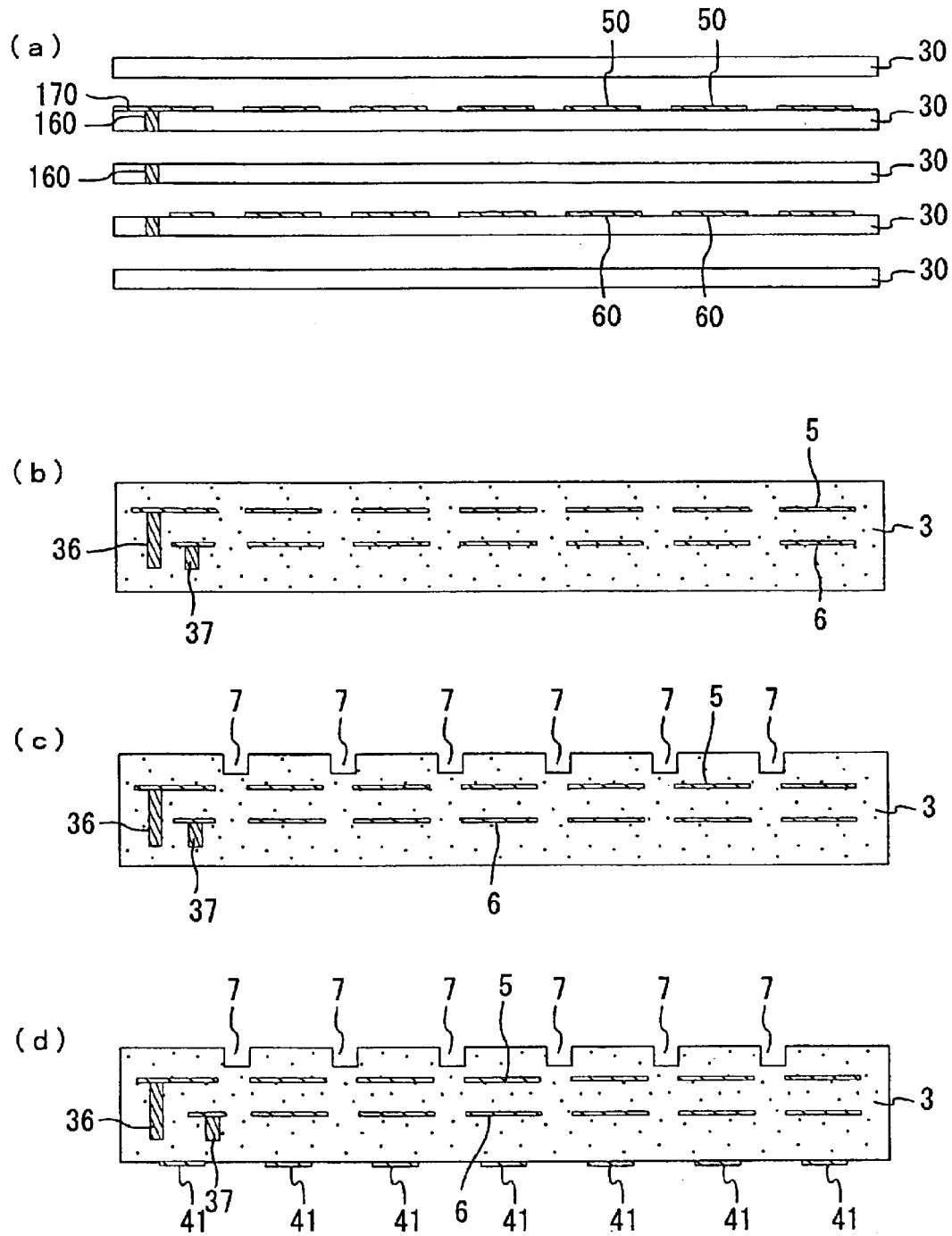
FIGS. 4(a) to (d) are schematic views showing a part of the flow of production of the substrate for the wafer prober according to the invention.
Figure 5:
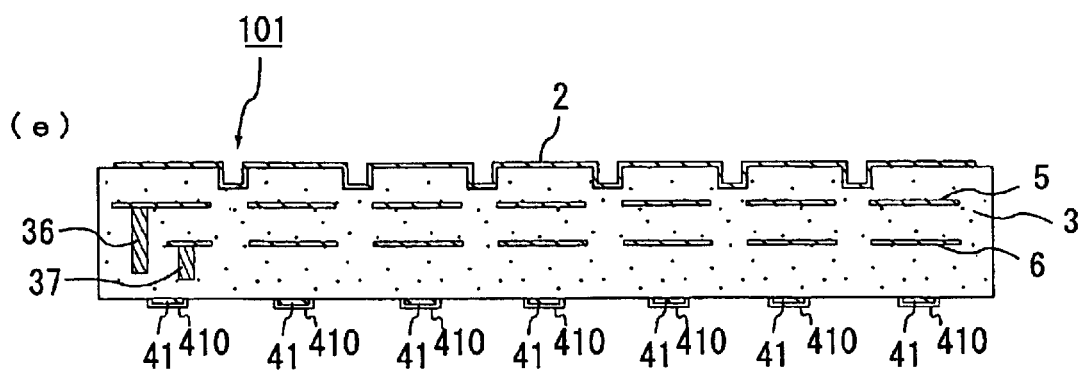
FIGS. 5(e) to (g) are schematic views showing a further part of the flow of production of the substrate for the wafer prober according to the invention.
Figure 5:
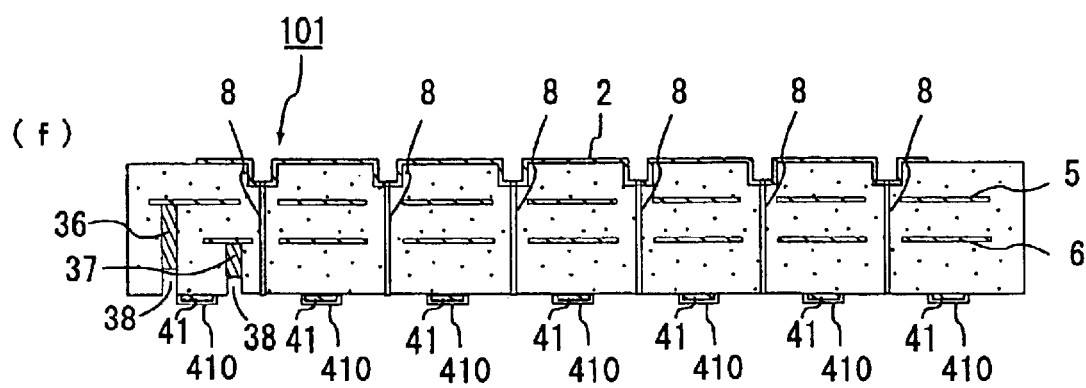
Figure 5:
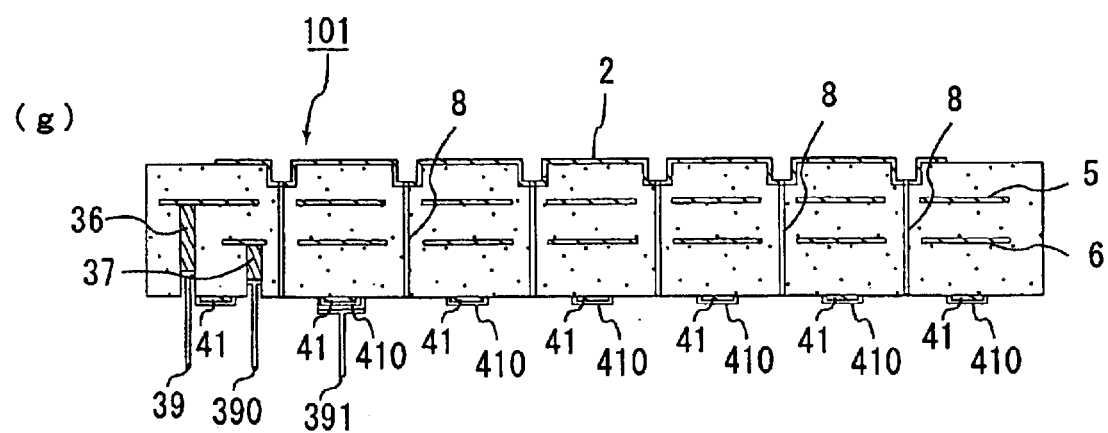

Manufacture of a Substrate for a Wafer Prober (Reference to FIGS. 4, 5)

(1) A paste was prepared by compounding 100 weight parts of above-mentioned aluminum nitride powder of Example 1 (average particle diameter: 1.1 µm) with 4 weight parts of yttria (average particle diameter: 0.4 µm), 11.5 weight parts of acrylic binder, 0.5 weight part of dispersant and 53 weight parts of alcohol (1-butanol and ethanol), and using the paste, a 0.47 mm-thick green sheet was molded by the doctor blade method.

(2) This green sheet was dried at 80° C. for 5 hours and then punched to form through holes to serve as the conductor-filled through holes for connecting the resistant heating element to external terminals.

(3) A conductor containing paste A was prepared by compounding 100 weight parts of a tungsten carbide powder having a mean particle diameter of 1 µm, 3.0 weight parts of acrylic binder, 3.5 weight parts of the solvent α-terpineol, and 0.3 weight part of dispersant.

A conductor containing paste B was prepared by compounding 100 weight parts of a tungsten powder having a mean particle diameter of 3 µm, 1.9 weight parts of acrylic binder, 3.7 weight parts of the solvent α-terpineol, and 0.2 weight part of dispersant.

Using said conductor containing paste A, the green sheet 30 was printed with the guard electrode printing pattern 50 and the ground electrode printing pattern 60 in the grid form by the screen printing technique.

Moreover, the through holes for serving as through-holes for connection to external terminals were filled with the conductor containing paste B to produce a filled layer 160.

In addition, the printed green sheet 30 was laminated with 50 units of the unprinted green sheet at a temperature of 130° C. and a pressure of 80 kg/cm$^2$ (FIG. 4(*a*)).

(4) The resulting laminate was degreased in a nitrogen gas atmosphere at 600° C. for 5 hours and hot-pressed at 1890° C. and 150 kg/cm$^2$ for 3 hours to provide a 3 mm-thick aluminum nitride plate. From this plate, a disk with a diameter of 230 mm was cut out to give a ceramic substrate 3 (FIG. 4(*b*)) The size of conductor-filled through holes 36, 37 was 0.2 mm in diameter and 0.2 mm in depth. The thickness of guard electrode 5 and ground electrode 6 was 10 μm and the position of the guard electrode 5 was 1.2 mm from the grooved surface, while that of the ground electrode 6 was 1 mm away from the bottom face.

(5) The ceramic substrate 3 obtained in step (4) was polished with a diamond wheel and, with a mask set in position, cavities (not shown) for accepting thermocouples and grooves 7 (0.5 mm wide×0.5 mm thick) for absorption of a wafer were formed by sandblasting with SiC or the like (FIG. 4(*c*)).

(6) Then, a resistance heating element pattern is printed on the surface opposite to the surface formed with grooves 7. This printing was formed with a conductor containing paste. The conductor containing paste used was Solbest PS603D from Tokuriki Kagaku Kenkyusho, which is in common use for the formation of plated-through holes in printed circuit boards. This conductor containing paste is a silver-lead paste containing 7.5 weight %, based on the weight of silver, of the metal oxide comprising lead oxide, zinc oxide, silica, boron oxide and alumina (5/55/10/25/5, by weight).

The silver was a scaly powder with a mean particle diameter of 4.5 μm.

(7) The ceramic substrate 3 printed with the conductor containing paste was baked at 780° C. to sinter the silver and lead in the conductor containing paste and bake them onto the ceramic substrate 3 to provide a resistance heating element 41. (FIG. 4(*d*)) Further, this ceramic substrate 3 was dipped in an electroless nickel plating bath comprising an aqueous solution of nickel sulfate: 30 g/l, boric acid: 30 g/l, ammonium chloride: 30 g/l and Rochelle salt: 60 g/l to deposit a 1 μm-thick metal covering layer 410 comprising nickel layer with a boron content of not more than 1 weight % on the surface of the sintered silver. The substrate was then subjected to annealing at 120° C. for 3 hours.

The pattern of resistance heating element 410 of the silver sintered body was 5 μm thick×2.4 mm wide and the area resistivity was 7.7 mΩ/□.

(8) On the surface formed with grooves 7, a titanium layer, a molybdenum layer and a nickel layer were serially constructed by sputtering. As the sputtering equipment, Japan Vacuum Technology's SV-4540 was used. Sputtering conditions were 0.6 Pa, 100° C. and 200 W and the sputtering time was adjusted for each metal species within the range of 30 seconds to 1 minute.

The deposition thickness estimated from the image output of a fluorescent X-ray analyzer was 0.3 μm for the titanium layer, 2 μm for the molybdenum layer and 1 μm for the nickel layer.

(9) The ceramic substrate obtained in the above step (8) was dipped in an electroless nickel plating bath comprising an aqueous solution of nickel sulfate: 30 g/l, boric acid: 30 g/l, ammonium chloride: 30 g/l, and Rochelle salt: 60 g/l to form a 7 μm-thick nickel plating layer with a boron content of not more than 1 weight % on the surface of grooves 7, followed by 3 hours of annealing at 120° C.

The above ceramic substrate was further dipped in an electroless gold plating bath containing gold potassium cyanide: 2 g/l, ammonium chloride: 75 g/l, sodium citrate: 50 g/l, and sodium hypophosphite: 10 g/l at 93° C. for 1 minute to construct a 1 m-thick gold plating layer on the nickel plate for use as said chuck top conductor layer 2.

(10) The substrate was drilled to form air suction holes 8 extending from the grooves 7 to the reverse side. In addition, blind holes 38 were formed for exposing the conductor-filled through holes (FIG. 5(*f*)). In the blind holes 38, external terminals 39, 390 composed of Kovar were secured in position with a gold brazing material composed of Ni—Au alloy (Au: 81.5%, Ni: 18.4%, impurity: 0.1%) heated for reflow at 970° C.

In addition, external terminals 391 made of Kovar were securely attached and fixed to the resistance heating element 41 (nickel layer 410) through a solder (tin:lead=9/1) layer. (FIG. 5(*g*)).

(11) A plurality of sheath-type thermocouples for temperature control were embedded in said cavities to complete a wafer prober.

Example 7

Aluminum nitride was produced in accordance with Example of synthesis except that the adsorbent was dispersed into the solution and then the solution was allowed to stand still under vibration at 25° C. for 0.5 hour. A ceramic heater was then manufactured in the same way as in Example 1.

Example 8

Aluminum nitride was produced in accordance with Example of synthesis except that the adsorbent was dispersed into the solution and then the solution was allowed to stand still under vibration at 25° C. for 1 hour. A ceramic heater was then manufactured in the same way as in Example 1.

Example 9

Aluminum nitride was produced in accordance with Example of synthesis except that the adsorbent was dispersed into the solution and then the solution was allowed to stand still under vibration at 25° C. for 5 hours. A ceramic heater was then manufactured in the same way as in Example 1.

Comparative Example 1

The present comparative example was the same as Example 1, but the porous γ-Fe$_2$O$_3$ treatment was not conducted.

Comparative Example 2

The present comparative example was the same as Example 2, but the treatment for removing U and Th was not conducted.

Comparative Example 3

The present comparative example was the same as Example 3, but the treatment for removing U and Th was not conducted.

About each of the ceramic heaters and the substrate for a wafer prober obtained in Examples 1 to 9 and Comparative Examples 1 to 3, the level of the radiated α-rays was measured. About each of the ceramic heaters and the substrate for a wafer prober, the change ratio of the thermal conductivity thereof after 10000 hours passed was measured. The change ratios are shown in Table 1.

(1) Conditions for Measuring the Level of α-Rays

Measuring instrument: Low-level α-counter ACS-4000M
Voltage applied: 1.9 kV
Counting gas: PR-10 gas (Ar: 90%, methane: 10%)
Sample area: 387 cm$^2$
Total counting time: 99 hr.
Counting efficiency: 80%
Range of error: ±0.003 c/cm$^2$·hr (2) Method of Measuring the Thermal Conductivity a. An Equipment to be Employed Rigaku-laser flash thermal constant measurement equipment LF/TCM-FA8510B b. Testing Conditions temperature: 100° C., 200° C., 400° C., 800° C.
ambient condition: vacuum c. Measurement Method The temperature detection in specific heat measurement was carried out by using a thermocouple (Platinel) bounded to the back face of each sample by a silver paste.

Normal-temperature specific heat measurement was carried out by further adhering a light receiving plate (glassy carbon) to the upper face of each sample by silicon grease and the specific heat (Cp) of each sample was calculated according to the following calculation equation (1):

$$Cp = \left\{\frac{\Delta Q}{\Delta T} - Cp_{G.C} \cdot W_{G.C} - Cp_{S.G} \cdot W_{S.G}\right\}\frac{1}{W} \qquad (1)$$

In the above-mentioned calculation equation (1), $\Delta Q$ represents the input energy, $\Delta T$ represents the saturation value of the temperature rise of each sample, $Cp_{G.C}$ represents the specific heat of the glassy carbon, $W_{G.C}$ represents the weight of the glassy carbon, $Cp_{S.G}$ represents the specific heat of the silicon grease, $W_{S.G}$ represents the weight of the silicon grease, and W represents the weight of each sample.

In each of the Examples including Examples 5 and 6, the temperature of the heater was raised to 140° C. after passage of 10000 hours from the manufacturing of the heater, and then a silicon wafer of 25° C. temperature was put on the heater. The control operation of the heater was judged on the basis of the following: whether or not the temperature of the heating face returned to 140° C. or not (the setting property).

The setting property was controlled by a temperature-adjuster (E5ZE made by Omron Corp.) having a control unit having a power source, a memory unit and a calculation unit.

Figure 6:
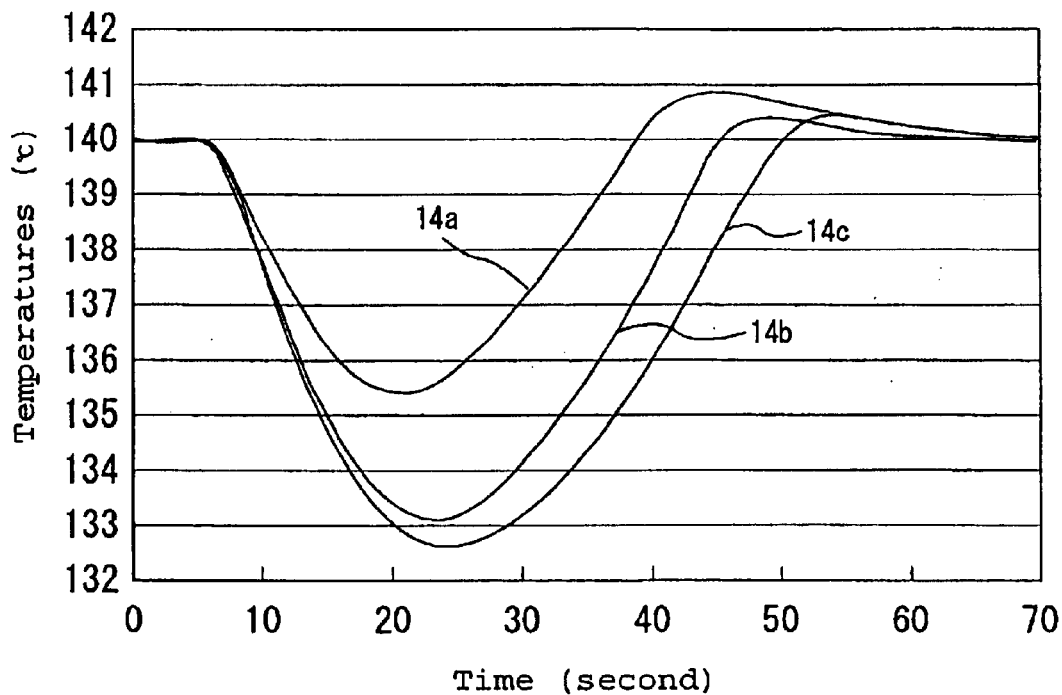
FIG. 6 is a graph showing the relation between the temperature change of the silicone wafer and time when the silicone wafer of the ambient temperature is placed on the ceramic heater having increased temperature.
Figure 6:
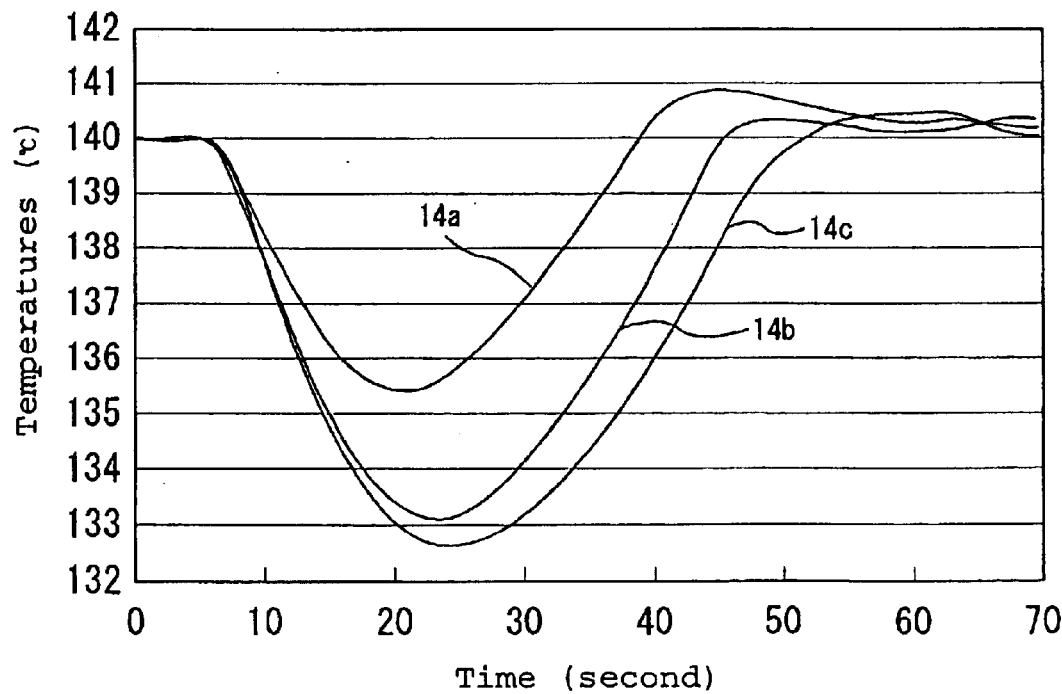

Relationship between the temperature of the bottomed holes in the ceramic heater and time was measured. The results are shown in FIG. 6. FIG. 6(A) is related to the case of the ceramic heater according to Example 1, and FIG. 6(B) is related to the case of the ceramic heater according to Comparative Example 1.

As illustrated in FIG. 6, in the ceramic heater according to Example 1, the temperature thereof returned to 140° C. in 70 seconds. However, in the ceramic heater according to Comparative Example 1, the temperature thereof was not set back to 140° C.

TABLE 1

| | The level of α-rays (c/cm$^2$·hr) | Change ratio of the thermal conductivity (%) | | | | | Setting property |
|---|---|---|---|---|---|---|---|
| | | 25° C. | 100° C. | 200° C. | 400° C. | 800° C. | |
| Example 1 | 0.26 | 0 | 0 | 0 | 0 | 0 | Good |
| Example 2 | 0.35 | 0.1 | 0 | 0 | 0 | 0 | Good |
| Example 3 | 5.50 | 1 | 0.2 | 0 | 0 | 0 | Good |
| Example 4 | 18.00 | 2 | 1.5 | 1.0 | 1.0 | 0.1 | Good |
| Example 5 | 0.26 | 0 | 0 | 0 | 0 | 0 | Good |
| Example 6 | 0.26 | 0 | 0 | 0 | 0 | 0 | Good |
| Example 7 | 50 | 2 | 1.5 | 1.0 | 1.0 | 0.1 | Good |
| Example 8 | 5.0 | 0.6 | 0 | 0 | 0 | 0 | Good |
| Example 9 | 1.0 | 0.1 | 0 | 0 | 0 | 0 | Good |
| Comparative Example 1 | 52 | 20 | 15 | 10 | 5 | 0.5 | Poor |
| Comparative Example 2 | 55 | 20 | 15 | 10 | 5 | 0.5 | Poor |
| Comparative Example 3 | 53 | 20 | 15 | 10 | 5 | 0.5 | Poor |

From the table, it can be seen that when the α-ray level exceeds 50 c/cm$^2$·hr, a change in the thermal conductivity becomes extremely large regardless of the heater is made of oxide, nitride or carbide. It is presumed that this fact is based on the fact that the energy required for dissociating bonds has a threshold.

When the level of α-rays is 5 c/cm$^2$·hour or less, no change in the thermal conductivity is observed at 100° C. or more. Further, when the level of α-rays is 1 c/cm$^2$·hour or less, the change in the thermal conductivity is 0.1% even at ambient temperature. Thus, even after passage of 10 years, the level of α-rays is about 1%. Therefore, it can be understood that no problems are caused for practical use.

As the temperature becomes higher, the change ratio in the thermal conductivity becomes smaller. This is because: the thermal conductivity of any ceramic becomes lower as the temperature thereof becomes higher; and the thermal conductivity already lowered by the effect of α-rays does not drop so easily at high temperature.

The reason why the thermal conductivity of any ceramic varies at high temperature would be based on the following: lattice defects move so that heat-conduction is blocked, and the dissociation of bonds, which is caused by the effect of α-rays, suppresses the move of the lattice defects.

Industrial Applicability

As described above, according to the ceramic heater, the electrostatic chuck, or the substrate for a wafer prober of the present invention, the level of radiated α-rays is small and a change in the thermal conductivity thereof over time is also small. Moreover, the controllability thereof is also superior.

What is claimed is:

1. A ceramic heater comprising a ceramic substrate and a heating element disposed on a surface of the ceramic substrate or inside the ceramic substrate, wherein the level of α-rays radiated from said ceramic substrate exceeds 0.25 c/cm$^2$·hr and is not higher than 50 c/cm$^2$·hr.

2. The ceramic heater according to claim 1, wherein said ceramic substrate is in a disk form.

3. The ceramic heater according to claim 1, wherein said ceramic substrate comprises a nitride ceramic, a carbide ceramic or an oxide ceramic.

4. The ceramic heater according to claim 1, wherein said ceramic substrate contains a sintering aid.

5. The ceramic heater according to claim 1, wherein said ceramic substrate comprises a bottomed hole and a temperature probe embedded in the bottomed hole.

6. The ceramic heater according to claim 1, wherein said ceramic heater is used at a temperature of −100° C. to 800° C.

7. The ceramic heater according to claim 1, wherein said ceramic heater heats a semiconductor wafer distanced from the ceramic substrate.

8. The ceramic heater according to claim 1, wherein the level of α-rays radiated from said ceramic substrate is not higher than 5 c/cm$^2$·hr.

9. The ceramic heater according to claim 1, wherein said ceramic substrate is in a disk form having a diameter of 200 mm or more.

10. The ceramic heater according to claim 1, wherein said ceramic substrate has a thickness of 0.5 to 50 mm.

* * * * *